United States Patent
Pang et al.

(10) Patent No.: US 12,347,093 B2
(45) Date of Patent: Jul. 1, 2025

(54) METHOD AND APPARATUS FOR FAULT ISOLATION, COMPUTER DEVICE, MEDIUM AND PROGRAM PRODUCT

(71) Applicant: China Electronics Reliability And Environmental Testing Institute, Guangzhou (CN)

(72) Inventors: Chao Pang, Guangzhou (CN); Yiqiang Ni, Guangzhou (CN); Liang He, Guangzhou (CN); Shizheng Yang, Guangzhou (CN); Yinle Li, Guangzhou (CN)

(73) Assignee: China Electronics Reliability And Environmental Testing Institute (CN)

(*) Notice: Subject to any disclaimer, the term of this patent is extended or adjusted under 35 U.S.C. 154(b) by 389 days.

(21) Appl. No.: 18/074,964

(22) Filed: Dec. 5, 2022

(65) Prior Publication Data
US 2024/0037727 A1    Feb. 1, 2024

(30) Foreign Application Priority Data
Jul. 28, 2022 (CN) .......................... 202210897252.3

(51) Int. Cl.
G06T 7/00 (2017.01)
G01N 25/72 (2006.01)
(Continued)

(52) U.S. Cl.
CPC .......... *G06T 7/0008* (2013.01); *G01N 25/72* (2013.01); *G05B 23/0256* (2013.01);
(Continued)

(58) Field of Classification Search
CPC .... H10D 88/00; H10D 88/01; H01L 2924/14; H01L 2224/32145; H01L 25/0657;
(Continued)

(56) References Cited

U.S. PATENT DOCUMENTS

2021/0407833 A1* 12/2021 Kaira ................ H01L 21/67288
2023/0317408 A1* 10/2023 Tong ..................... H01J 37/045
                                                            250/307

FOREIGN PATENT DOCUMENTS

CN          101320072 B  *   4/2011

OTHER PUBLICATIONS

Search machine translation of CN 101320072 B to Li et al., Based On Infrared Sequence Image Super-resolution Reconstruction Method Of Thermal Analysis Testing System, translated Feb. 19, 2025, 15 pages. (Year: 2025).*

* cited by examiner

*Primary Examiner* — Henok Shiferaw
*Assistant Examiner* — Dennis Rosario
(74) *Attorney, Agent, or Firm* — Lerner David LLP

(57) ABSTRACT

A method for fault isolation includes: acquiring a thermal imaging picture of a surface of a to-be-tested chip, the thermal imaging picture being obtained by scanning the to-be-tested chip to which a test signal is applied through an infrared thermal imaging device, and analyzing the thermal imaging picture to obtain a phase angle of each point on the surface of the to-be-tested chip; acquiring a three-dimensional image of the surface of the to-be-tested chip, the three-dimensional image being obtained by scanning the to-be-tested chip to which the test signal is applied through an image scanning device, and analyzing the three-dimensional image to obtain a three-dimensional coordinate of each point on the surface of the to-be-tested chip; calculating a three-dimensional coordinate of the fault in the to-be-tested chip according to the phase angle and the three-dimensional coordinate of each point on the surface of the to-be-tested chip.

10 Claims, 4 Drawing Sheets

(51) Int. Cl.
*G05B 23/02* (2006.01)
*G06T 15/08* (2011.01)
*H01L 23/00* (2006.01)
*H04N 23/23* (2023.01)
*H10D 88/00* (2025.01)
*H01L 25/065* (2023.01)

(52) U.S. Cl.
CPC ............ *G05B 23/0275* (2013.01); *G06T 7/00* (2013.01); *G06T 7/0002* (2013.01); *G06T 15/08* (2013.01); *H01L 24/95* (2013.01); *H04N 23/23* (2023.01); *H10D 88/00* (2025.01); *G05B 2219/31356* (2013.01); *G06T 2200/04* (2013.01); *G06T 2207/30148* (2013.01); *G06T 2211/461* (2023.08); *H01L 25/0657* (2013.01); *H01L 2224/0231* (2013.01); *H01L 2224/05001* (2013.01); *H01L 2224/0508* (2013.01); *H01L 2224/08145* (2013.01); *H01L 2224/16145* (2013.01); *H01L 2224/32145* (2013.01); *H01L 2224/48145* (2013.01); *H01L 2225/06503* (2013.01); *H01L 2924/14* (2013.01)

(58) Field of Classification Search
CPC ........... H01L 2224/08145; H01L 24/94; H01L 2224/0508; H01L 2224/05075; H01L 2224/05001; H01L 2224/0231; H01L 2224/0239; H01L 2224/024; H01L 2224/0237; H01L 2224/0233; H01L 2224/02331; H01L 2224/02335; H01L 2224/0235; H01L 2224/0236; H01L 2224/05082; H01L 2224/05083; H01L 2224/05084; H01L 2225/06562; H01L 2225/06555; H01L 2225/06503; H01L 25/074; H01L 24/95; H01L 2224/08221; H01L 2224/16145; H01L 2224/48145; H01L 2225/06568; H01L 2224/32221; H01L 2224/48221; H10B 20/50; H10B 63/84; G11C 29/70; G05B 19/4184; G05B 2219/49023; G05B 19/4099; G05B 2219/35134; G05B 2219/35146; G05B 2219/35152; G05B 2219/35115; G05B 2219/35036; G05B 2219/35136; G05B 2219/35138; G05B 2219/35145; G05B 2219/35318; G05B 2219/35365; G05B 2219/35415; G05B 2219/35416; G05B 2219/35421; G05B 2219/35533; G05B 2219/49005; G05B 2219/49007; G05B 2219/49008; G05B 2219/49011; G05B 2219/49012; G05B 2219/49019; G05B 2219/49246; G05B 2219/35266; G05B 23/0221; G05B 23/0218; G05B 23/02; G05B 23/00; G05B 23/0205; G05B 23/0248; G05B 23/0259; G05B 23/0262; G05B 23/0267; G05B 23/0275; G05B 23/0289; G05B 23/0291; G05B 23/0256; G05B 2219/31356; G05B 2219/31357; G05B 2219/31355; G05B 2219/31359; G05B 2219/31366; G05B 2219/31439; G05B 2219/34477; G05B 23/0237; G05B 2219/31302; G05B 2219/34449; G05B 2219/34455; G05B 2219/34491; G05B 2223/02; G05B 2219/50192; G05B 2223/04; G05B 2219/31337; G05B 2219/34294; G05B 2219/34355; G05B 2219/34369; G05B 2219/34453; G05B 2219/34469; G05B 2219/35227; G05B 2219/50102; G05B 2219/50185; G05B 2219/45031; G05B 2219/45032; G05B 2219/4717; G05B 2219/45035; G06T 2207/30148; G06T 17/00; G06T 2207/30141; G06T 7/0004; G06T 2207/30108; G06T 15/00; G06T 15/205; G06T 15/005; G06T 2215/06; G06T 2219/00; G06T 2219/20; G06T 19/00; G06T 19/003; G06T 19/20; G06T 2200/04; G06T 2200/08; G06T 19/006; G06T 13/20; G06T 7/00; G06T 2211/461; G06T 3/067; G06T 7/0002; G06T 7/0006; G06T 7/0008; G06T 7/001; G06T 7/262; G06T 7/168; G06T 15/08; G06T 7/60; G06T 2207/10012; G01N 25/72; H04N 23/23

See application file for complete search history.

METHOD AND APPARATUS FOR FAULT ISOLATION, COMPUTER DEVICE, MEDIUM AND PROGRAM PRODUCT

CROSS REFERENCE TO RELATED APPLICATION

The present application claims priority to Chinese Patent Application with No. 202210897252.3, entitled "Method and Apparatus for Fault Isolation, Computer Device, Medium and Program Product", and filed on Jul. 28, 2022, the content of which is expressly incorporated herein by reference in its entirety.

TECHNICAL FIELD

The present disclosure relates to the field of integrated circuit detection technology, and particularly to a method and an apparatus for fault isolation, a computer device, a medium and a program product.

BACKGROUND

With the development of electronic products toward miniaturization, high density, high reliability and low power consumption, three-dimensional (3D) advanced packaging that integrates multiple chips and devices in the same package body has become a new direction to meet the development of technology. Stacked 3D packaging has broad application prospects in emerging industries such as the artificial intelligence, autonomous driving, 5G networks, and the Internet of Things because of the characteristics such as the high integration, light mass, small packaging size, and low manufacturing cost, etc.

However, in a multi-layer stacked 3D packaging structure, due to the increased process complexity, a failure fault may occur at the wiring, via holes in any component, or interconnections for connecting the components. As package thickness increases and feature size shrinks, new challenges are posed for fault isolation in the 3D packaging. First, the geometric structure in the 3D packaging is highly complex and getting smaller, so that the accuracy of fault isolation becomes more important. In the current technology, the accuracy of fault isolation in the multi-layer stacked chips, particularly in the depth direction, is very low.

SUMMARY

In view of the above, it is necessary to provide a method and an apparatus for fault isolation, a computer device, a medium and a program product which can improve the accuracy of the fault isolation in the chip.

In the first respect, the present disclosure provides a method for fault isolation, including:
acquiring a thermal imaging picture of a surface of a to-be-tested chip, wherein the thermal imaging picture is obtained by scanning the to-be-tested chip to which a test signal is applied through an infrared thermal imaging device, and analyzing the thermal imaging picture to obtain a phase angle of each point on the surface of the to-be-tested chip;
acquiring a three-dimensional image of the surface of the to-be-tested chip, wherein the three-dimensional image is obtained by scanning the to-be-tested chip to which the test signal is applied through an image scanning device, and analyzing the three-dimensional image to obtain a three-dimensional coordinate of each point on the surface of the to-be-tested chip;
calculating a three-dimensional coordinate of the fault in the to-be-tested chip according to the phase angle and the three-dimensional coordinate of each point on the surface of the to-be-tested chip.

In an embodiment, the acquiring the thermal imaging picture of a surface of a to-be-tested chip, wherein the thermal imaging picture is obtained by scanning the to-be-tested chip to which a test signal is applied through an infrared thermal imaging device, and analyzing the thermal imaging picture to obtain a phase angle of each point on the surface of the to-be-tested chip includes:
scanning, by the infrared thermal imaging device, the to-be-tested chip to obtain the thermal imaging picture of the surface of the to-be-tested chip;
performing digitized phase-locked signal coherence processing on the thermal imaging picture by using a sine function reference signal with the same phase-locked frequency as the test signal, to obtain a corresponding linear average function;
obtaining the phase angle of each point on the surface of the to-be-tested chip by calculating according to the sine function reference signal and the linear average function.

In an embodiment, the method further includes:
after performing the digitized phase-locked signal coherence processing on the thermal imaging picture by using the sine function reference signal with the same phase-locked frequency as the test signal, to obtain the corresponding linear average function,
obtaining a temperature amplitude of each point on the surface of the to-be-tested chip by calculating according to the sine function reference signal and the linear average function.

In an embodiment, the calculating the three-dimensional coordinate of the fault in the to-be-tested chip according to the phase angle and the three-dimensional coordinate of each point on the surface of the to-be-tested chip includes:
determining an area in a horizontal direction where the fault is located according to the temperature amplitude of each point on the surface of the to-be-tested chip;
calculating the three-dimensional coordinate of the fault in the to-be-tested chip according to the phase angle of each point on the surface of the to-be-tested chip and a three-dimensional coordinate corresponding to each point in the area.

In an embodiment, the method further includes:
calculating the three-dimensional coordinate of the fault in the to-be-tested chip through a following formula:

$$\Phi = \frac{z_{\mathit{eff}}}{\Lambda} = \frac{\sqrt{(x-x_0)^2 + (y-y_0)^2 + (z-z_0)^2}}{\Lambda}$$

in which $\Phi$ denotes the phase angle, $Z_{\mathit{eff}}$ denotes an equivalent distance between the fault and each point on the surface of the to-be-tested chip, $\Lambda$ denotes a thermal diffusion length of a material of the to-be-tested chip, a three-dimensional coordinate of any point on the surface of the to-be-tested chip is denoted as $(x, y, z)$, and the three-dimensional coordinate of the fault is denoted as $(x_0, y_0, z_0)$.

In an embodiment, the calculating the three-dimensional coordinate of the fault in the to-be-tested chip according to the phase angle and the three-dimensional coordinate of each point on the surface of the to-be-tested chip includes:

performing parameter fitting by substituting the phase angel and the three-dimensional coordinate of each point on the surface of the to-be-tested chip into the formula, to obtain the three-dimensional coordinate of the fault in the to-be-tested chip with a maximum goodness of fit.

In the second aspect, the present disclosure provides an apparatus for fault isolation, including:

a phase angle acquisition module, configured to acquire a thermal imaging picture of a to-be-tested chip, wherein the thermal imaging picture is obtained by scanning the to-be-tested chip to which a test signal is applied through an infrared thermal imaging device, and analyze the thermal imaging picture to obtain a phase angle of each point on the surface of the to-be-tested chip;

a three-dimensional coordinate acquisition module, configured to acquire a three-dimensional image of the surface of the to-be-tested chip, wherein the three-dimensional image is obtained by scanning the to-be-tested chip to which the test signal is applied through an image scanning device, and analyze the three-dimensional image to obtain a three-dimensional coordinate of each point on the surface of the to-be-tested chip;

a fault isolation module, configured to calculate a three-dimensional coordinate of the fault in the to-be-tested chip according to the phase angle and the three-dimensional coordinate of each point on the surface of the to-be-tested chip.

In the third aspect, the present disclosure provides a computer device, including a processor and a memory for storing a computer program, the processor, when executing the computer program, implements the following steps of:

acquiring a thermal imaging picture of a surface of a to-be-tested chip, wherein the thermal imaging picture is obtained by scanning the to-be-tested chip to which a test signal is applied through an infrared thermal imaging device, and analyzing the thermal imaging picture to obtain a phase angle of each point on the surface of the to-be-tested chip;

acquiring a three-dimensional image of the surface of the to-be-tested chip, wherein the three-dimensional image is obtained by scanning the to-be-tested chip to which the test signal is applied through an image scanning device, and analyzing the three-dimensional image to obtain a three-dimensional coordinate of each point on the surface of the to-be-tested chip;

calculating a three-dimensional coordinate of the fault in the to-be-tested chip according to the phase angle and the three-dimensional coordinate of each point on the surface of the to-be-tested chip.

In the fourth aspect, the present disclosure further provides a computer-readable storage medium, on which a computer program is stored, when the computer program is executed by a processor, the following steps are implements:

acquiring a thermal imaging picture of a surface of a to-be-tested chip, wherein the thermal imaging picture is obtained by scanning the to-be-tested chip to which a test signal is applied through an infrared thermal imaging device, and analyzing the thermal imaging picture to obtain a phase angle of each point on the surface of the to-be-tested chip;

acquiring a three-dimensional image of the surface of the to-be-tested chip, wherein the three-dimensional image is obtained by scanning the to-be-tested chip to which the test signal is applied through an image scanning device, and analyzing the three-dimensional image to obtain a three-dimensional coordinate of each point on the surface of the to-be-tested chip;

calculating a three-dimensional coordinate of the fault in the to-be-tested chip according to the phase angle and the three-dimensional coordinate of each point on the surface of the to-be-tested chip.

In the fifth aspect, the present disclosure further provides a computer program product, including a computer program, when the computer program is executed by a processor, the following steps are implemented:

acquiring a thermal imaging picture of a surface of a to-be-tested chip, wherein the thermal imaging picture is obtained by scanning the to-be-tested chip to which a test signal is applied through an infrared thermal imaging device, and analyzing the thermal imaging picture to obtain a phase angle of each point on the surface of the to-be-tested chip;

acquiring a three-dimensional image of the surface of the to-be-tested chip, wherein the three-dimensional image is obtained by scanning the to-be-tested chip to which the test signal is applied through an image scanning device, and analyzing the three-dimensional image to obtain a three-dimensional coordinate of each point on the surface of the to-be-tested chip;

calculating a three-dimensional coordinate of the fault in the to-be-tested chip according to the phase angle and the three-dimensional coordinate of each point on the surface of the to-be-tested chip.

In the method and apparatus for fault isolation, the computer device, the storage medium and the computer program product, a thermal imaging picture of a surface of a to-be-tested chip is acquired, in which the thermal imaging picture is obtained by scanning the to-be-tested chip to which a test signal is applied through an infrared thermal imaging device, and the thermal imaging picture is analyzed to obtain a phase angle of each point on the surface of the to-be-tested chip; a three-dimensional image of the surface of the to-be-tested chip is acquired, in which the three-dimensional image is obtained by scanning the to-be-tested chip to which the test signal is applied through an image scanning device, and the three-dimensional image is analyzed to obtain a three-dimensional coordinate of each point on the surface of the to-be-tested chip; a three-dimensional coordinate of the fault in the to-be-tested chip is calculated according to the phase angle and the three-dimensional coordinate of each point on the surface of the to-be-tested chip. By this way, the present disclosure implements the spatial isolation by combining the phase angle of each point on the surface of the to-be-tested chip and the three-dimensional coordinate of each point on the surface of the to-be-tested chip. Accordingly, the present disclosure can implement the quick fault isolation and is not affected by the geometric structure of the chip, so that the accuracy of the fault isolation is high.

DETAILED DESCRIPTION

In order to make the purpose, technical solution and advantages of the present disclosure clearer, the present disclosure will be further detailed below with reference to the accompanying drawings and embodiments. It should be appreciated that the embodiments described herein are merely used for explanation of the present disclosure, rather than limiting the present disclosure.

Figure 1:
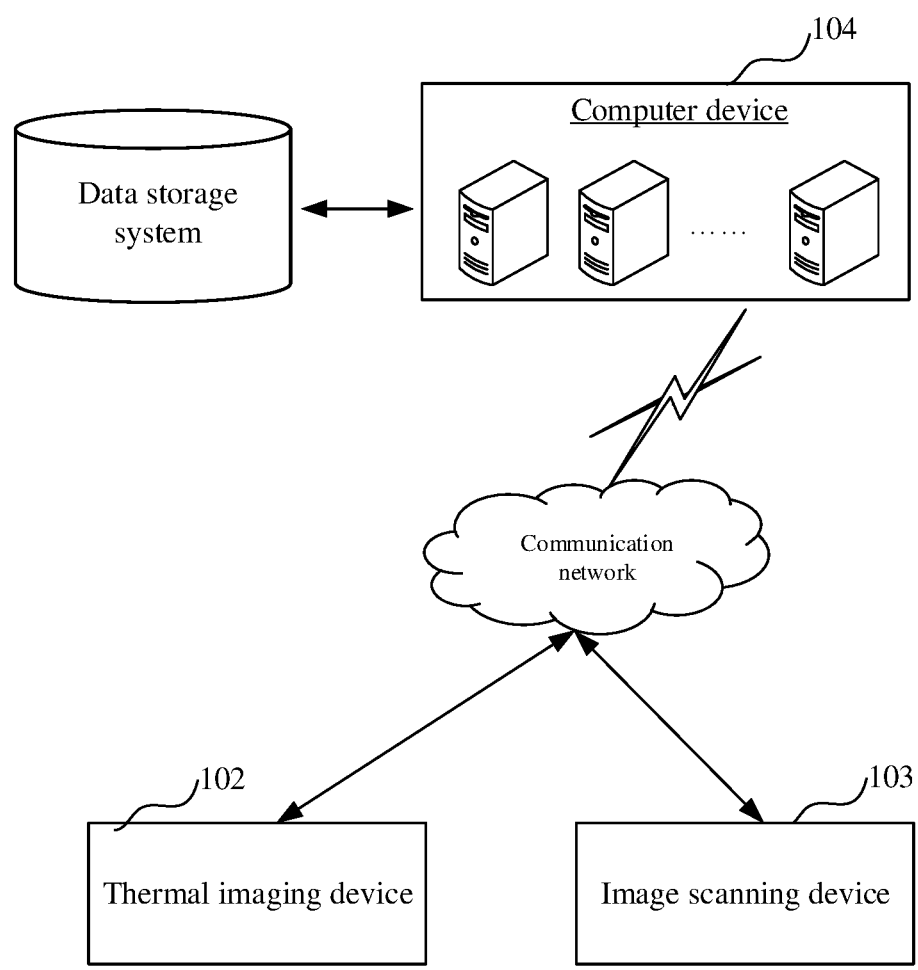
FIG. 1 is an application environment diagram of a method for fault isolation according to an embodiment.

The method for fault isolation provided by the embodiment in the present disclosure can be applied to an application environment as shown in FIG. 1, in which the system includes an infrared thermal imaging device 102, an image scanning device 103, and a computer device 104. The infrared thermal imaging device 102 and the image scanning device 103 are capable of communicating with a server via a wired or wireless manner. A data storage system can store data to be processed by the server. The data storage system can be integrated on the server or provided on the cloud or other web server. The infrared thermal imaging device 102 is configured to scan a to-be-tested chip and obtain a thermal imaging picture. The image scanning device 103 is configured to scan the to-be-tested chip and obtain a three-dimensional coordinate of each point on a surface of the to-be-tested chip. The infrared thermal imaging device 102 transmits the obtained thermal imaging picture to the computer device 104. The image scanning device 103 transmits the obtained three-dimensional coordinate of each point on the surface of the to-be-tested chip to the computer device 104. The computer device 104 obtains a three-dimensional coordinate of a fault in the to-be-tested chip by calculating according to the thermal imaging image of the to-be-tested chip and the three-dimensional coordinate of each point on the surface of the to-be-tested chip. The infrared thermal imaging device 102 may be, but is not limited to, a variety of infrared cameras, infrared imagers, etc.; and the image scanning device 103 may be, but is not limited to, a variety of lidar scanners, portable scanners, etc. The computer device 104 may be, but is not limited to, a variety of personal computers, laptops, smartphones, tablets, Internet of Things devices, and portable wearable devices. The Internet of Things device may be a smart speaker, a smart TV, a smart air conditioner, and the like. The portable wearable device may be a smart watch, a smart bracelet, a head wear device, etc.

Figure 2:
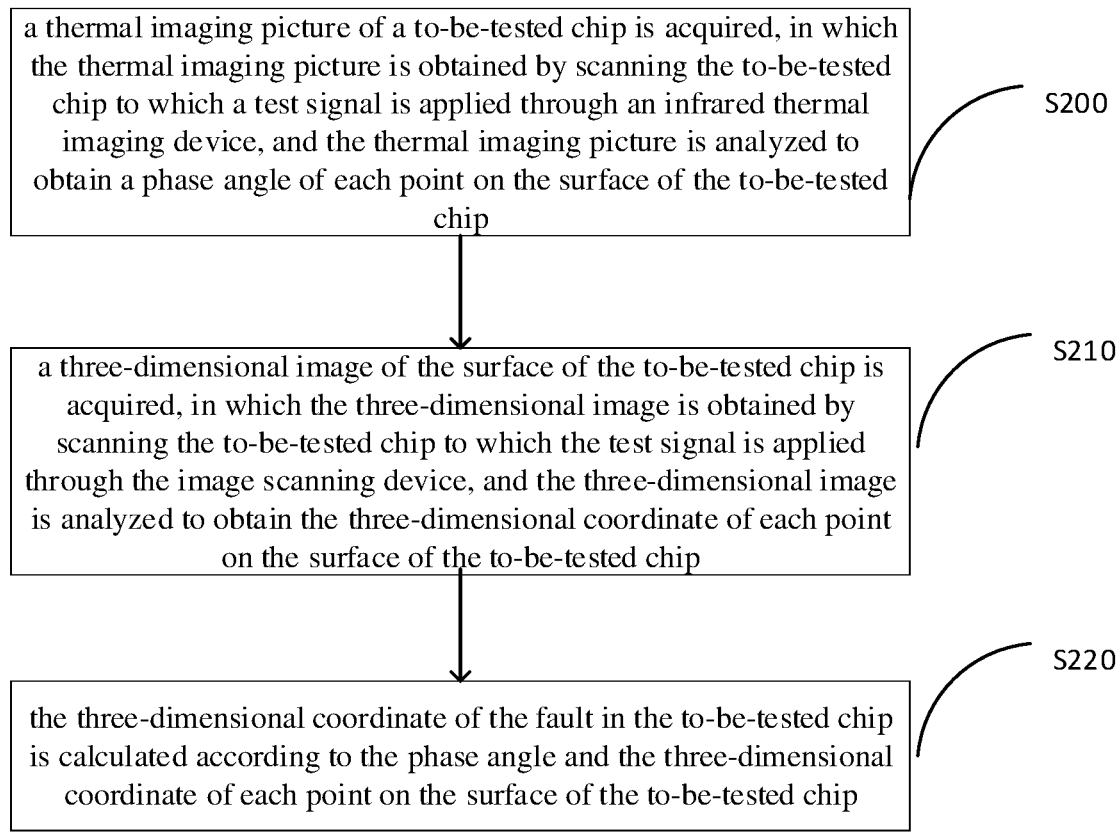
FIG. 2 is a flow chart of a method for fault isolation according to an embodiment.

In an embodiment, as shown in FIG. 2, a method for fault isolation is provided, including the following steps.

Step S200: a thermal imaging picture of a to-be-tested chip is acquired, in which the thermal imaging picture is obtained by scanning the to-be-tested chip to which a test signal is applied through an infrared thermal imaging device, and the thermal imaging picture is analyzed to obtain a phase angle of each point on the surface of the to-be-tested chip.

In the existing technology, e.g., the Lock-In Thermography (LIT), when the fault isolation is performed on the 3D packaging chip, the thermal wave diffusion of the fault has a strong damping effect, which is exponentially related to a transmission distance. The detection capability, i.e., the surface temperature increases, the surface temperature may increase with the increase of the lock-in frequency, so that the increase in the lock-in frequency may increase the thermal transmission of the thermal source of the fault in the z-axis direction, and improve the detection capability. However, the increase in the frequency may also add the thermal transmission of the thermal source of the fault in the x, y-axis directions, such that the diameter of the fault is increased, and the accuracy of the result cannot be guaranteed.

In the embodiment, the method is applied to the computer device in FIG. 1 as an example. The computer device can control the infrared thermal imaging device to scan the to-be-tested chip to which the test signal is applied; and the infrared thermal imaging device transmits the thermal imaging picture of the surface of the to-be-tested chip obtained by the scanning to the computer device; the computer device analyzes the received thermal imaging picture by using the method described above, so that the phase angle Φ of each point on the surface of the to-be-tested chip can be obtained.

Specifically, as an embodiment, the step S200 may comprise following steps.

Step S201: the to-be-tested chip is scanned by the infrared thermal imaging device to obtain the thermal imaging picture of the to-be-tested chip.

Step S202: digitized phase-locked signal coherence processing is performed on the thermal imaging picture to obtain a corresponding linear average function.

Step S203: the phase angle of each point on the surface of the to-be-tested chip is obtained by calculating according to a first voltage, a second voltage and the linear average function.

In the process of fault isolation, the test signal shall be applied to the to-be-tested chip. After the test signal is applied to the to-be-tested chip, heat is generated at the fault and other hot spots in the to-be-tested chip (the fault in the present disclosure is a hot spot of abnormal fever in the to-be-tested chip). The heat generated by each hot spot and fault is transmitted to the surface of the to-be-tested chip in the form of heat wave. The heat wave can be represented by a heat wave function as follows:

$$F(t) = A \sin(2\pi f_{lock-in} t + \Phi); \quad (1)$$

where, A represents a surface temperature amplitude; Φ represents the phase angle (phase shift); $f_{lock-in}$ denotes the phase-locked frequency of the test signal; and t represents time.

The test signal is generally an electric excitation signal. The electric excitation signal is generally a square wave (which can also be an electric excitation signal in other forms in specific embodiments). Of course, in the specific embodiments, the electric excitation signal can also be in the form of sine, cosine, triangle, etc.

A sine function reference signal with the same phase-locked frequency as that of the test signal is applied to the to-be-tested chip. As an embodiment, the sine function reference signal is respectively represented as $S^{0°}$ and $S^{-90°}$. $S^{0°}$ represents the sine function reference signal with the phase angle of 0°; and $S^{-90°}$ represents the sine function reference signal with the phase angle of −90°. In some specific embodiments, two sine function reference signals $S^{0°}$ and $S^{90°}$ can also be adopted, which only requires that the phase relationship between the sine function reference signal and the test signal is the same (which can also be understood as a phase relationship difference 90° between to the two signals). After the sine function reference signal is applied, the digitized phase-locked signal coherence processing is performed via a computer (after the coherence processing, the noise points can be removed and only the hot spots of phase-locked frequency are left), a linear average within an integral can be obtained as follows:

$$S = \frac{1}{nN} \sum_{i=1}^{N} \sum_{j=1}^{n} F_j K_{i,j}; \quad (2)$$

where, $i \in [1, N]$, $j \in [1, n]$, and n denotes the number of digitized signals in each phase-locked period of the two sine function reference signals; N denotes the number of phase-locked periods; $F_j$, $K_{i,j}$ respectively represent temperature fluctuations on the surface of the to-be-tested chip to which the two sine function reference signals are applied.

An image of the phase angle Φ of the surface of the to-be-tested chip is calculated according to outputs of the two sine function reference signals as follows:

$$\Phi = \arctan\left(-\frac{S^{-90°}}{S^{0°}}\right) - 180° \quad$$

(if $S^{0°}$ is negative) (3)

For point heat source configuration in semi-infinite model, the phase angle of the surface temperature sine function can be expressed as a function of a distance between the thermal source and a detection position, a material property, and phase-locked frequency as follows:

$$\Phi = \frac{z}{\Lambda}; \quad (4)$$

where, z denotes the distance between the thermal source and the fault; Λ denotes a material thermal diffusion length.

The thermal diffusion length Λ of the material of the to-be-tested chip is a fixed attribute of the material of the to-be-tested chip. In the practical application, the thermal diffusion length Λ can be pre-stored. When using, the pre-stored thermal diffusion length Λ can be looked for and used. In a specific embodiment, the thermal diffusion length Λ can also be obtained through the following manner.

The thermal diffusion length is obtained by calculating according to the phase-locked frequency $f_{lock-in}$.

The thermal diffusion length Λ is defined as $$\Lambda = \sqrt{\frac{a}{\pi f_{lock-in}}},$$

describing the damping of heat waves inside bulk materials.

Where $\alpha = \lambda/(C_p*\rho)$ represents the material thermal diffusivity, and can be obtained by a thermal conductivity λ, a specific heat capacity $C_p$ and a density ρ of the to-be-tested chip.

In other words, the thermal diffusion length can also be obtained by calculating according to the thermal conductivity λ, the specific heat capacity $C_p$, the density ρ, and the phase-locked frequency $f_{lock-in}$.

Specifically, the calculation is performed via the following formula:

$$\Lambda = \sqrt{\frac{2*\lambda}{C_p*\rho*2\pi f_{lock-in}}}.$$

In the practical application, the thermal diffusion length Λ can be looked for and used.

It can be understood that these skilled in the art can know that the functions of analysis of the thermal imaging pictures and obtaining of the phase angle of each point on the surface of the to-be-tested chip can also be integrated into the infrared thermal imaging device. In the embodiment, the phase angle of the to-be-tested chip can be obtained by using the LIT technology, and other algorithms, such as Pulsed Thermography (PT) or Pulsed Phase Thermography (PPT), can also be used in the specific embodiments, as long as the technology can obtain the phase angle Φ of each point on the surface of the to-be-tested chip, which is not limited herein.

It should be noted that, in order to improve the accuracy of the result, in the practical application, multiple excitation signals with different phase-locked frequencies can be applied to the to-be-tested chip. According to the obtained test results corresponding to the multiple excitation signals, the excitation signal with the optimal test result is selected as the test signal, and the phase angle Φ of each point on the surface of the to-be-tested chip obtained corresponding to the selected test signal is processed subsequently.

Step S210: a three-dimensional image of the surface of the to-be-tested chip is acquired, in which the three-dimensional image is obtained by scanning the to-be-tested chip to which the test signal is applied through the image scanning device, and the three-dimensional image is analyzed to obtain the three-dimensional coordinate of each point on the surface of the to-be-tested chip.

The computer device can control the image scanning device to scan and analyze the to-be-tested chip, receive the three-dimensional image of the surface of the to-be-tested chip from the image scanning device, and then analyze the received three-dimensional image to obtain the three-dimensional coordinate of each point on the surface of the to-be-tested chip. This step can be performed after or before the phase angle Φ of each point on the surface of the to-be-tested chip is obtained, or can even be performed while obtaining the phase angle Φ of each point on the surface of the to-be-tested chip.

It can be understood that those skilled in the art can know the function of analyzing the three-dimensional image and obtaining the three-dimensional coordinate of each point on the surface of the to-be-tested chip can also be integrated into the image scanning device. In addition, it should be noted that in order to ensure the accuracy of the result, the position of the to-be-tested chip is kept unchanged in the process of scanning the to-be-tested chip to obtain the phase angle and the three-dimensional coordinate respectively.

Step S220: the three-dimensional coordinate of the fault in the to-be-tested chip is calculated according to the phase angle and the three-dimensional coordinate of each point on the surface of the to-be-tested chip.

After the phase angle Φ and the three-dimensional coordinate of each point on the surface of the to-be-tested chip are obtained, the three-dimensional coordinate of the fault in the to-be-tested chip can be calculated according to the phase angle and the three-dimensional coordinate of each point.

Specific processes may include the following contents.

Assuming that the coordinate of the failed point is known and is expressed as $(x_0, y_0, z_0)$, it should be noted that the coordinate system in which the failed point is located is the same as that in which the three-dimensional coordinate is obtained in the above steps.

A distance between the fault Defect $(x_0, y_0, z_0)$ and any point $(x, y, z)$ on the surface is defined as an equivalent distance $Z_{eff}$, and then $$z_{eff} = \sqrt{(x-x_0)^2+(y-y_0)^2+(z-z_0)^2};$$

combined with the following formula (5) and the phase angle, $$\Phi = \frac{z_{eff}}{A} = \frac{\sqrt{(x-x_0)^2 + (y-y_0)^2 + (z-z_0)^2}}{A}; \quad (5)$$

the parameter fitting is performed by substituting the obtained phase angel and three-dimensional coordinate of each point on the surface of the to-be-tested chip into the above formula (5), and the coordinate of the fault can be obtained. The parameter fitting can be implemented by using the existing parameter fitting method.

In the above-mentioned method for fault isolation, the to-be-tested chip to which the test signal is applied is scanned by the infrared thermal imaging device to obtain the thermal imaging picture of the surface of the to-be-tested chip; and the thermal imaging picture is analyzed to obtain the phase angle of each point on the surface of the to-be-tested chip; the to-be-tested chip to which the test signal is applied is scanned by the image scanning device to obtain the three-dimensional image of the to-be-tested chip, and the three-dimensional image is analyzed to obtain the three-dimensional coordinate of each point on the surface of the to-be-tested chip; the three-dimensional coordinate of the fault in the to-be-tested chip is calculated according to the phase angle and the three-dimensional coordinate of each point on the surface of the to-be-tested chip. Through the above manner, the present disclosure implements the spatial isolation by combining the phase angle and the three-dimensional coordinate of each point on the surface of the to-be-tested chip. Accordingly, the present disclosure can implement the quick fault isolation without being affected by the geometric structure of the chip, so that the accuracy of the fault isolation is high.

In an embodiment, after the digitized phase-locked signal coherence processing is performed on the thermal imaging picture to obtain the corresponding linear average function, the method further includes:

a temperature amplitude of each point on the surface of the to-be-tested chip is obtained by calculating according to the sine function reference signals and the linear average function.

The image of the temperature amplitude A of the surface of the to-be-tested chip is calculated according to the outputs of the two sine function reference signals, as follows:

$$A = \sqrt{(S^{0\circ})^2 + (S^{-90\circ})^2}.$$

In an embodiment, the step of calculating the three-dimensional coordinate of the fault in the to-be-tested chip according to the phase angle and the three-dimensional coordinate of each point on the surface of the to-be-tested chip may include the following steps.

Step S221: an area in a horizontal direction where the fault is located is determined according to the temperature amplitude of each point on the surface of the to-be-tested chip.

Step 222: the three-dimensional coordinate of the fault in the to-be-tested chip is calculated according to the phase angle of each point on the surface of the to-be-tested chip and a three-dimensional coordinate corresponding to each point in the area.

As an embodiment, based on the obtained image of the temperature amplitude A, the area where the fault is located can be determined in the horizontal direction according to the obtained image of the amplitude, that is, the area on the surface of the to-be-tested chip where the fault is located is determined. Then, the three-dimensional coordinate of the fault can be calculated by using the three-dimensional coordinate and the phase angle of each point in the area on the surface.

In the embodiment, by the above-mentioned manner, the image of the temperature amplitude of each point on the surface of the to-be-tested chip is calculated first to determine the area where the fault is located, and then the three-dimensional coordinate of the fault is calculated by using the phase angle of and the three-dimensional coordinate of each point in the area, accordingly, the accuracy of the three-dimensional coordinate of the fault can be improved.

It should be appreciated that, although the steps in the flow charts to which the various embodiments relate as described above are shown sequentially as indicated by the arrows, these steps are not definitely performed sequentially as indicated by the arrows. Unless explicitly stated in this article, these steps are not strictly sequential and can be performed in other order. Moreover, at least part of the steps in the flow charts to which the various embodiments relate as described above may include a plurality of steps or stages that are not definitely performed at the same time, but may be performed at different time, and the steps or stages may not be definitely performed sequentially, but may be performed in turns or alternately with at least a part of the other steps or steps.

Based on the same inventive concept, in an embodiment of the present disclosure, an apparatus for fault isolation is provided. The solution for addressing the technical problem provided by the apparatus is similar to that described in the above method, so that as for the specific limitation on the apparatus for fault isolation in one or more embodiments below, reference can be made to the limitation on the method for fault isolation in the above, which will not be repeated here.

Figure 3:
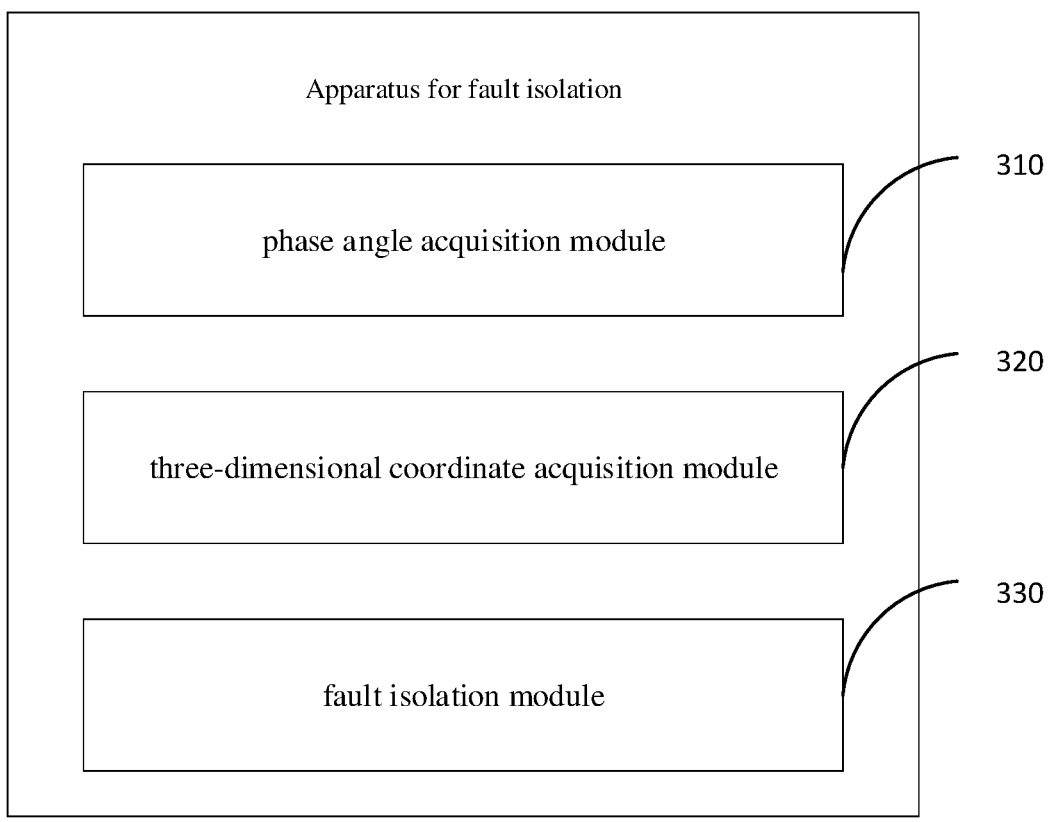
FIG. 3 is a schematic structure diagram of an apparatus for fault isolation according to an embodiment.

In an embodiment, as shown in FIG. 3, an apparatus for fault isolation is provided, including:

a phase angle acquisition module 310, configured to acquire a thermal imaging picture of a to-be-tested chip, in which the thermal imaging picture is obtained by scanning the to-be-tested chip to which a test signal is applied through an infrared thermal imaging device, and analyze the thermal imaging picture to obtain a phase angle of each point on the surface of the to-be-tested chip;

a three-dimensional coordinate acquisition module 320, configured to acquire a three-dimensional image of the surface of the to-be-tested chip, in which the three-dimensional image is obtained by scanning the to-be-tested chip to which the test signal is applied through the image scanning device, and analyze the three-dimensional image to obtain a three-dimensional coordinate of each point on the surface of the to-be-tested chip;

a fault isolation module 330, configured to calculate the three-dimensional coordinate of the fault in the to-betested chip according to the phase angle and the three-dimensional coordinate of each point on the surface of the to-be-tested chip.

In an embodiment, the test signal includes a first voltage and a second voltage which are mutually orthogonal voltages, and the phase angle acquisition module 310 is further configured to:

scan the to-be-tested chip by the infrared thermal imaging device to obtain the thermal imaging picture of the surface of the to-be-tested chip;

perform digitized phase-locked signal coherence processing on the thermal imaging picture by using a sine function reference signal with the same phase-locked frequency as the test signal, to obtain a corresponding linear average function;

obtain the phase angle of each point on the surface of the to-be-tested chip by calculating according to the sine function reference signal and the linear average function.

In an embodiment, the apparatus for fault isolation further includes:

a temperature amplitude acquisition module (not shown), configured to obtain a temperature amplitude of each point on the surface of the to-be-tested chip by calculating according to the sine function reference signal and the linear average function.

In an embodiment, the fault isolation module 330 is further configured to:

determine an area in a horizontal direction where the fault is located according to the temperature amplitude of each point on the surface of the to-be-tested chip;

calculate the three-dimensional coordinate of the fault in the to-be-tested chip according to the phase angle of each point on the surface of the to-be-tested chip and a three-dimensional coordinate corresponding to each point in the area.

In an embodiment, the fault isolation module 330 is further configured to calculate the three-dimensional coordinate of the fault in the to-be-tested chip through the following formula:

$$\Phi = \frac{z_{\mathit{eff}}}{\Lambda} = \frac{\sqrt{(x-x_0)^2 + (y-y_0)^2 + (z-z_0)^2}}{\Lambda};$$

where $\Phi$ denotes the phase angle, $Z_{\mathit{eff}}$ denotes an equivalent distance between the fault and each point on the surface of the to-be-tested chip, $\Lambda$ denotes the thermal diffusion length of the material of the to-be-tested chip, a three-dimensional coordinate of any point on the surface of the to-be-tested chip is denoted as (x, y, z), and a three-dimensional coordinate of the fault is denoted as $(x_0, y_0, z_0)$.

In an embodiment, the fault isolation module 330 is further configured to:

perform the parameter fitting by substituting the obtained phase angel and three-dimensional coordinate of each point on the surface of the to-be-tested chip into the formula, to obtain the three-dimensional coordinate of the fault in the to-be-tested chip with a maximum goodness of fit.

Each module in the above-mentioned apparatus for fault isolation can be implemented in whole or in part by software, hardware and a combination thereof. The above modules may be embedded in or independent of a processor in a computer device in the hardware form, or stored in a memory in the computer device in the software form, so that the processor can invoke and perform operations corresponding to the above modules.

Figure 4:
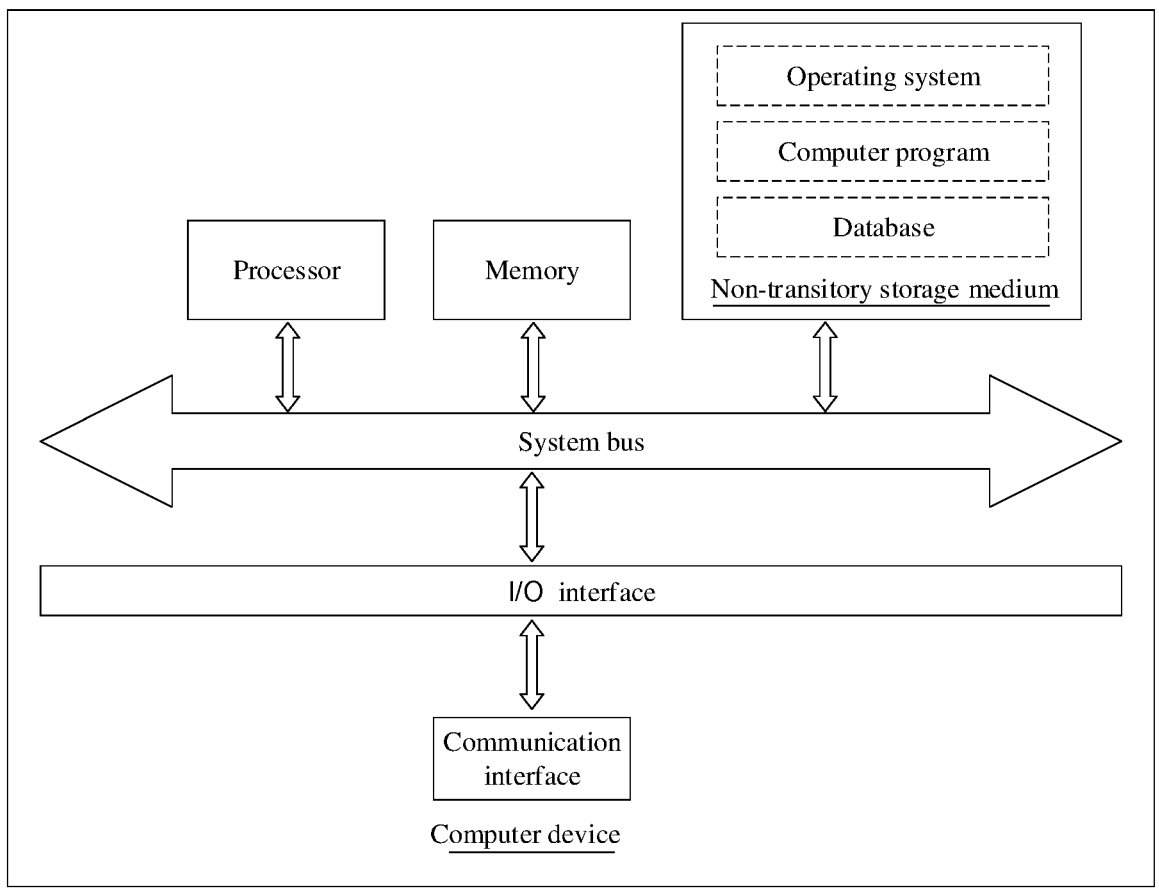
FIG. 4 is an internal structure diagram of a computer device according to an embodiment.

In an embodiment, a computer device is provided, which may be a server, and an internal structure thereof may be shown in FIG. 4. The computer device includes a processor, a memory, and a network interface connected via a system bus. The processor of the computer device is configured to provide computing and control capabilities. The memory of the computer device includes a non-transitory storage medium and an internal memory. The non-transitory storage medium stores an operating system, a computer program, and a database. The internal memory provides an environment for the operating system and computer program in non-transitory storage medium. The database of the computer device can be configured to store the phase angle and the three-dimensional coordinate of each point on the surface of the to-be-tested chip, or can be configured to store the phase angle and the three-dimensional coordinate of each point on the surface of the to-be-tested chip, the thermal imaging picture and the three-dimensional image of the to-be-tested chip. The network interface of the computer device is configured to communicate with an external terminal through a network connection. The computer program is executed by the processor to implement a method for fault isolation.

It should be appreciated by those skilled in the art that the structure shown in FIG. 4 is merely a block diagram of a partial structure relevant to the solution of the present disclosure and does not constitute a limitation to the computer device to which the present solution is applied; and the specific computer device may include more or fewer components than that shown, or may combine some components, or may have a different arrangement of components.

In an embodiment, a computer device is provided, which includes a processor and a memory storing a computer program, the processor, when executing the computer program, implements the steps of:

acquiring a thermal imaging picture of a surface of a to-be-tested chip, in which the thermal imaging picture is obtained by scanning the to-be-tested chip to which a test signal is applied through an infrared thermal imaging device, and analyzing the thermal imaging picture to obtain a phase angle of each point on the surface of the to-be-tested chip;

acquiring a three-dimensional image of the surface of the to-be-tested chip, in which the three-dimensional image is obtained by scanning the to-be-tested chip to which the test signal is applied through the image scanning device, and analyzing the three-dimensional image to obtain a three-dimensional coordinate of each point on the surface of the to-be-tested chip;

calculating a three-dimensional coordinate of the fault in the to-be-tested chip according to the phase angle and the three-dimensional coordinate of each point on the surface of the to-be-tested chip.

In an embodiment, the processor, when executing the computer program, further implements the following steps:

the test signal includes a first voltage and a second voltage which are mutually orthogonal voltages, and the step of acquiring the thermal imaging picture of the surface of the to-be-tested chip, in which the thermal imaging picture is obtained by scanning the to-be-tested chip to which a test signal is applied through an infrared thermal imaging device, and analyzing the thermal imaging picture to obtain the phase angle of each point on the surface of the to-be-tested chip includes steps of:

scanning the to-be-tested chip by the infrared thermal imaging device to obtain the thermal imaging picture of the surface of the to-be-tested chip;

performing digitized phase-locked signal coherence processing on the thermal imaging picture by using a sine function reference signal with the same phase-locked frequency as the test signal, to obtain a corresponding linear average function;

obtaining the phase angle of each point on the surface of the to-be-tested chip by calculating according to the sine function reference signal and the linear average function.

In an embodiment, the processor, when executing the computer program, further implements the following step of:

after performing the digitized phase-locked signal coherence processing on the thermal imaging picture by using the sine function reference signal with the same phase-locked frequency as the test signal, to obtain the corresponding linear average function, obtaining a temperature amplitude of each point on the surface of the to-be-tested chip by calculating according to the sine function reference signal and the linear average function.

In an embodiment, the processor, when executing the computer program, further implements the following steps of:

determining an area in a horizontal direction where the fault is located according to the temperature amplitude of each point on the surface of the to-be-tested chip;

calculating the three-dimensional coordinate of the fault in the to-be-tested chip according to the phase angle of each point on the surface of the to-be-tested chip and a three-dimensional coordinate corresponding to each point in the area.

In an embodiment, the processor, when executing the computer program, further implements the following step of:

calculating the three-dimensional coordinate of the fault in the to-be-tested chip through the following formula:

$$\Phi = \frac{z_{eff}}{A} = \frac{\sqrt{(x-x_0)^2 + (y-y_0)^2 + (z-z_0)^2}}{A};$$

in which $\Phi$ denotes the phase angle, $Z_{eff}$ denotes an equivalent distance between the fault and each point on the surface of the to-be-tested chip, A denotes a thermal diffusion length of a material of the to-be-tested chip, a three-dimensional coordinate of any point on the surface of the to-be-tested chip is denoted as (x, y, z), and the three-dimensional coordinate of the fault is denoted as $(x_0, y_0, z_0)$.

In an embodiment, the processor, when executing the computer program, further implements the following steps of:

performing the parameter fitting by substituting the obtained phase angel and three-dimensional coordinate of each point on the surface of the to-be-tested chip into the formula, to obtain the three-dimensional coordinate of the fault in the to-be-tested chip with a maximum goodness of fit.

In an embodiment, a computer-readable storage medium is provided, on which a computer program is stored that, a processor, when executing the computer program, implements the following steps of:

acquiring a thermal imaging picture of a surface of a to-be-tested chip, in which the thermal imaging picture is obtained by scanning the to-be-tested chip to which a test signal is applied through an infrared thermal imaging device, and analyzing the thermal imaging picture to obtain a phase angle of each point on the surface of the to-be-tested chip;

acquiring a three-dimensional image of the surface of the to-be-tested chip, in which the three-dimensional image is obtained by scanning the to-be-tested chip to which the test signal is applied through the image scanning device, and analyzing the three-dimensional image to obtain a three-dimensional coordinate of each point on the surface of the to-be-tested chip;

calculating a three-dimensional coordinate of the fault in the to-be-tested chip according to the phase angle and the three-dimensional coordinate of each point on the surface of the to-be-tested chip.

In an embodiment, the processor, when executing the computer program, further implements the following steps:

the test signal includes a first voltage and a second voltage which are mutually orthogonal voltages, and the step of acquiring the thermal imaging picture of the surface of the to-be-tested chip, in which the thermal imaging picture is obtained by scanning the to-be-tested chip to which a test signal is applied through an infrared thermal imaging device, and analyzing the thermal imaging picture to obtain the phase angle of each point on the surface of the to-be-tested chip includes steps of:

scanning the to-be-tested chip by the infrared thermal imaging device to obtain the thermal imaging picture of the surface of the to-be-tested chip;

performing digitized phase-locked signal coherence processing on the thermal imaging picture by using a sine function reference signal with the same phase-locked frequency as the test signal, to obtain a corresponding linear average function;

obtaining the phase angle of each point on the surface of the to-be-tested chip by calculating according to the sine function reference signal and the linear average function.

In an embodiment, the processor, when executing the computer program, further implements the following step of:

obtaining a temperature amplitude of each point on the surface of the to-be-tested chip by calculating according to the sine function reference signal and the linear average function.

In an embodiment, the processor, when executing the computer program, further implements the following steps of:

determining an area in a horizontal direction where the fault is located according to the temperature amplitude of each point on the surface of the to-be-tested chip;

calculating the three-dimensional coordinate of the fault in the to-be-tested chip according to the phase angle of each point on the surface of the to-be-tested chip and a three-dimensional coordinate corresponding to each point in the area.

In an embodiment, the processor, when executing the computer program, further implements the following step of:

calculating the three-dimensional coordinate of the fault in the to-be-tested chip through the following formula:

$$\Phi = \frac{z_{\mathit{eff}}}{A} = \frac{\sqrt{(x-x_0)^2 + (y-y_0)^2 + (z-z_0)^2}}{A};$$

in which $\Phi$ denotes the phase angle, $Z_{\mathit{eff}}$ denotes an equivalent distance between the fault and each point on the surface of the to-be-tested chip, $\Lambda$ denotes a thermal diffusion length of a material of the to-be-tested chip, a three-dimensional coordinate of any point on the surface of the to-be-tested chip is denoted as (x, y, z), and the three-dimensional coordinate of the fault is denoted as $(x_0, y_0, z_0)$.

In an embodiment, the processor, when executing the computer program, further implements the following steps of:
performing the parameter fitting by substituting the obtained phase angel and three-dimensional coordinate of each point on the surface of the to-be-tested chip into the formula, to obtain the three-dimensional coordinate of the fault in the to-be-tested chip with a maximum goodness of fit.

In an embodiment, a computer program product is provided, which includes a computer program, a processor, when executing the computer program, implements steps of:
acquiring a thermal imaging picture of a surface of a to-be-tested chip, in which the thermal imaging picture is obtained by scanning the to-be-tested chip to which a test signal is applied through an infrared thermal imaging device, and analyzing the thermal imaging picture to obtain a phase angle of each point on the surface of the to-be-tested chip;
acquiring a three-dimensional image of the surface of the to-be-tested chip, in which the three-dimensional image is obtained by scanning the to-be-tested chip to which the test signal is applied through the image scanning device, and analyzing the three-dimensional image to obtain a three-dimensional coordinate of each point on the surface of the to-be-tested chip;
calculating a three-dimensional coordinate of the fault in the to-be-tested chip according to the phase angle and the three-dimensional coordinate of each point on the surface of the to-be-tested chip.

In an embodiment, the processor, when executing the computer program, further implements the following steps of:
scanning the to-be-tested chip by the infrared thermal imaging device to obtain the thermal imaging picture of the surface of the to-be-tested chip;
performing digitized phase-locked signal coherence processing on the thermal imaging picture by using a sine function reference signal with the same phase-locked frequency as the test signal, to obtain a corresponding linear average function;
obtaining the phase angle of each point on the surface of the to-be-tested chip by calculating according to the sine function reference signal and the linear average function.

In an embodiment, the processor, when executing the computer program, further implements the following step of:
obtaining a temperature amplitude of each point on the surface of the to-be-tested chip by calculating according to the sine function reference signal and the linear average function.

In an embodiment, the processor, when executing the computer program, further implements the following steps of:
determining an area in a horizontal direction where the fault is located according to the temperature amplitude of each point on the surface of the to-be-tested chip;
calculating the three-dimensional coordinate of the fault in the to-be-tested chip according to the phase angle of each point on the surface of the to-be-tested chip and a three-dimensional coordinate corresponding to each point in the area.

In an embodiment, the processor, when executing the computer program, further implements the following step of:
calculating the three-dimensional coordinate of the fault in the to-be-tested chip through the following formula:

$$\Phi = \frac{z_{\mathit{eff}}}{A} = \frac{\sqrt{(x-x_0)^2 + (y-y_0)^2 + (z-z_0)^2}}{A};$$

in which $\Phi$ denotes the phase angle, $Z_{\mathit{eff}}$ denotes an equivalent distance between the fault and each point on the surface of the to-be-tested chip, $\Lambda$ denotes a thermal diffusion length of a material of the to-be-tested chip, a three-dimensional coordinate of any point on the surface of the to-be-tested chip is denoted as (x, y, z), and the three-dimensional coordinate of the fault is denoted as $(x_0, y_0, z_0)$.

In an embodiment, the processor, when executing the computer program, further implements the following steps of:
performing the parameter fitting by substituting the obtained phase angel and three-dimensional coordinate of each point on the surface of the to-be-tested chip into the formula, to obtain the three-dimensional coordinate of the fault in the to-be-tested chip with a maximum goodness of fit.

Those skilled in the art can understand that all or part of the procedures in the method embodiments described above can be implemented by a computer program instructing related hardware. The computer program may be stored in a non-transitory computer-readable storage medium; and the computer program, when executed, may implement the method including the procedures in the method embodiments. Any reference to the memory, database, or other media used in the embodiments of the present disclosure may include at least one of non-transitory and transitory memories. The non-transitory memory may include a Read-Only Memory (ROM), a magnetic tape, a floppy disk, a flash memory, an optical memory, a high-density embedded non-transitory memory, a Resistive Random Access Memory (ReRAM), a Magnetoresistive Random Access Memory (MRAM), a Ferroelectric Random Access Memory (FRAM), a Phase Change Memory (PCM), a graphene memory, etc. The transitory memory may include a Random Access Memory (RAM) or an external cache memory, etc. By way of illustration rather than limitation, the RAM can take many forms, such as Static Random Access Memory (SRAM) or Dynamic Random Access Memory (DRAM). The databases referred to in the various embodiments of the present disclosure may include at least one of a relational database and a non-relational database. The non-relational databases may include, but is not limited to, a blockchain-based distributed database. The processor involved in the embodiments of the present disclosure may be a general purpose processor, a central processing unit, a graphics processor, a digital signal processor, a programmable logic, a quantum computing-based data processing logic, and the like, which are not limited thereto.

Each of the technical features of the above embodiments may be arbitrarily combined, and for the purpose of simplifying the description, all the possible combinations of each technical feature in the above embodiments are not described; however, as long as the combinations of the technical features are not contradictory, they shall be regarded as the scope of the present disclosure.

The above embodiments are merely some embodiments of the present disclosure, which are described in more detail, but cannot be understood as limiting the scope of the present disclosure. It should be noted that those skilled in the art can make certain modifications and improvements without departing from the concept of the present disclosure, which all fall within the protection scope of the present disclosure. Therefore, the scope of protection of the present disclosure shall be subject to the appended claims.

What is claimed is:

1. A method for fault isolation comprising:
   acquiring a thermal imaging picture of a surface of a to-be-tested chip, wherein the thermal imaging picture is obtained by scanning the to-be-tested chip to which a test signal is applied through an infrared thermal imaging device, and analyzing the thermal imaging picture to obtain a phase angle of each point on the surface of the to-be-tested chip;
   acquiring a three-dimensional image of the surface of the to-be-tested chip, wherein the three-dimensional image is obtained by scanning the to-be-tested chip to which the test signal is applied through an image scanning device, and analyzing the three-dimensional image to obtain a three-dimensional coordinate of each point on the surface of the to-be-tested chip; and
   calculating a three-dimensional coordinate of the fault in the to-be-tested chip according to the phase angle and the three-dimensional coordinate of each point on the surface of the to-be-tested chip.

2. The method according to claim 1, wherein the acquiring the thermal imaging picture of a surface of a to-be-tested chip, wherein the thermal imaging picture is obtained by scanning the to-be-tested chip to which a test signal is applied through an infrared thermal imaging device, and analyzing the thermal imaging picture to obtain a phase angle of each point on the surface of the to-be-tested chip comprises:
   scanning, by the infrared thermal imaging device, the to-be-tested chip to obtain the thermal imaging picture of the surface of the to-be-tested chip;
   performing digitized phase-locked signal coherence processing on the thermal imaging picture by using a sine function reference signal with the same phase-locked frequency as the test signal, to obtain a corresponding linear average function;
   obtaining the phase angle of each point on the surface of the to-be-tested chip by calculating according to the sine function reference signal and the linear average function.

3. The method according to claim 2, further comprising:
   after performing the digitized phase-locked signal coherence processing on the thermal imaging picture by using the sine function reference signal with the same phase-locked frequency as the test signal, to obtain the corresponding linear average function;
   obtaining a temperature amplitude of each point on the surface of the to-be-tested chip by calculating according to the sine function reference signal and the linear average function.

4. The method according to claim 3, wherein the calculating the three-dimensional coordinate of the fault in the to-be-tested chip according to the phase angle and the three-dimensional coordinate of each point on the surface of the to-be-tested chip comprises:
   determining an area in a horizontal direction where the fault is located according to the temperature amplitude of each point on the surface of the to-be-tested chip;
   calculating the three-dimensional coordinate of the fault in the to-be-tested chip according to the phase angle of each point on the surface of the to-be-tested chip and a three-dimensional coordinate corresponding to each point in the area.

5. The method according to claim 1, further comprising:
   calculating the three-dimensional coordinate of the fault in the to-be-tested chip through a following formula:

$$\Phi = \frac{z_{\mathit{eff}}}{A} = \frac{\sqrt{(x-x_0)^2 + (y-y_0)^2 + (z-z_0)^2}}{A}$$

wherein Φ denotes the phase angle, Zeff denotes an equivalent distance between the fault and each point on the surface of the to-be-tested chip, A denotes a thermal diffusion length of a material of the to-be-tested chip, a three-dimensional coordinate of any point on the surface of the to-be-tested chip is denoted as (x, y, z), and the three-dimensional coordinate of the fault is denoted as (x0, y0, z0).

6. The method according to claim 5, wherein the calculating the three-dimensional coordinate of the fault in the to-be-tested chip according to the phase angle and the three-dimensional coordinate of each point on the surface of the to-be-tested chip comprises:
   performing parameter fitting by substituting the phase angel and the three-dimensional coordinate of each point on the surface of the to-be-tested chip into the formula, to obtain the three-dimensional coordinate of the fault in the to-be-tested chip with a maximum goodness of fit.

7. An apparatus for fault isolation comprising:
   a processor configured to acquire a thermal imaging picture of a to-be-tested chip, wherein the thermal imaging picture is obtained by scanning the to-be-tested chip to which a test signal is applied through an infrared thermal imaging device, and analyze the thermal imaging picture to obtain a phase angle of each point on the surface of the to-be-tested chip;
   and configured to acquire a three-dimensional image of the surface of the to-be-tested chip, wherein the three-dimensional image is obtained by scanning the to-be-tested chip to which the test signal is applied through an image scanning device, and analyze the three-dimensional image to obtain a three-dimensional coordinate of each point on the surface of the to-be-tested chip; and
   configured to calculate a three-dimensional coordinate of the fault in the to-be-tested chip according to the phase angle and the three-dimensional coordinate of each point on the surface of the to-be-tested chip.

8. A computer device, comprising a processor and a memory for storing a computer program, wherein the processor, when executing the computer program, implements the method of claim 1.

9. A non-transitory computer-readable storage medium on which a computer program is stored, wherein when the computer program is executed by a processor, the method of claim 1 is implemented.

10. A non-transitory computer program product, comprising a computer program, wherein when the computer program is executed by a processor, the method of claim 1 is implemented.

* * * * *